(12) United States Patent
Said

(10) Patent No.: US 6,794,999 B1
(45) Date of Patent: Sep. 21, 2004

(54) RESILIENT PARAMETERIZED PREFIX CODES FOR ADAPTIVE CODING

(75) Inventor: Amir Said, Cupertino, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/698,817

(22) Filed: Oct. 31, 2003

(51) Int. Cl.⁷ .................................................. H03M 7/40
(52) U.S. Cl. .......................................... 341/67; 341/51
(58) Field of Search ............................. 341/67, 51, 50, 341/65, 56

(56) References Cited

U.S. PATENT DOCUMENTS

| | | | | | |
|---|---|---|---|---|---|
| 4,598,267 | A | * | 7/1986 | Fukuda | 341/58 |
| 6,392,705 | B1 | * | 5/2002 | Chaddha | 348/388.1 |
| 6,492,918 | B1 | * | 12/2002 | Rezzi et al. | 341/68 |
| 2003/0095597 | A1 | * | 5/2003 | Talluri et al. | 375/240.08 |

* cited by examiner

*Primary Examiner*—Peguy JeanPierre

(57) ABSTRACT

A prefix code set is defined by a set of parameters that define a number of code words in an initial class and the growth of at least one additional class of code words. The code is resilient to initial estimation errors in the code parameters.

36 Claims, 4 Drawing Sheets

RESILIENT PARAMETERIZED PREFIX CODES FOR ADAPTIVE CODING

BACKGROUND

Data compression can reduce the cost of storing large data files on computers, as well as the time for transmitting large data files between computers. The compression may be lossless, lossy, or a combination of the two. Lossy compression may be performed without significantly affecting the quality of data that will eventually be reconstructed. Lossless compression may be performed without affecting quality of reconstructed data.

A process called "entropy coding" is fundamental to data compression. Generally, this process is modeled by first defining a data source that provides data symbols $S_i$ belonging to the set $\{0, 1, 2, \ldots, M_i-1\}$ (the source alphabet) for integer indexes $i=0, 1, 2, \ldots$; and then converting the data symbols to a set of bits (e.g., a binary alphabet). An objective of the entropy coding is to minimize the number of bits required to represent the data symbols uniquely, without any loss of information.

One type of entropy coding is "prefix" coding. Prefix coding involves assigning an integer number of bits to each coded data symbol. Prefix codes have the property that no ambiguity about their code words is created by their concatenation. As bits are read sequentially to a decoder, the decoder always knows when it reaches the end of a code word and can put out a decoded data symbol. These codes are best represented by a tree structure, which guarantees the prefix property, and also permits visual interpretation of the code's properties. Every uniquely-decodable code can be translated into a prefix code with same compression properties The tree coding can be computationally efficient with table lookup ("TLU") for both encoding and decoding.

In practical applications, the conditional probabilities of the data symbols (M) are not known a priori. The computational complexity to determine an optimal tree code is proportional to M log(M) in the worst case, and proportional to M in the best case. Thus, when M is large, it is not practical to compute new optimal codes frequently, leading to loss in compression.

Moreover, table look-up is very fast only when the tables are not too large (preferably, when they can fit in CPU fast cache, or are accessed sequentially). If M is large, then the amount of memory to store the estimates, codes, and tables, also becomes prohibitively large.

A type of prefix codes called "Golomb codes" is optimal for certain common data symbol distributions. Each Golomb code is defined uniquely by a positive integer number m.

Golomb codes are defined for an infinite number of symbols. This is an advantage when working with large alphabets, the exact size of which is unknown (which is typically the case with one-pass coding). The code words for the most frequent symbols can be stored in tables, while the codes for the improbable symbols can be generated automatically.

In the special cases when $m=2^k$ (for $k=0, 1, 2, \ldots$), code words can be generated for all possible values using exactly $k$ bits, which is quite advantageous in practical applications. These particular codes are called Rice-Golomb codes.

A problem with the use of Golomb and Rice-Golomb codes is that they are not resilient to estimation errors in the code parameter m. The coding inefficiency grows too fast around an optimal point, so there is a large penalty (in bits) whenever the parameter m is not correctly estimated. For example, suppose the classification function estimates that the best Golomb code parameter is $m=1$. The symbol $S_i=300$ will be coded using 300 bits equal to 1, followed by a bit equal to 0. This is very inefficient.

SUMMARY

According to one aspect of the present invention, a prefix code set is defined by a set of parameters that define a number of code words in an initial class and the growth of at least one additional class of code words. The code is resilient to initial estimation errors in the code parameters.

Other aspects and advantages of the present invention will become apparent from the following detailed description, taken in conjunction with the accompanying drawings, illustrating by way of example the principles of the present invention.

DETAILED DESCRIPTION

Figure 1:
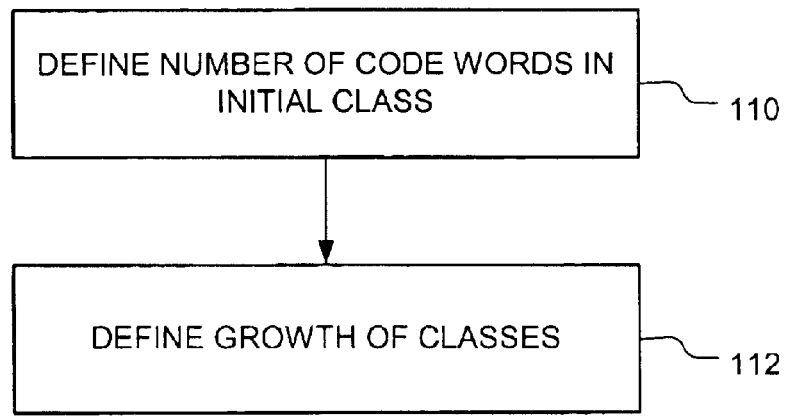
FIG. 1 is an illustration of a general method of defining a prefix code set in accordance with an embodiment of the present invention.

Reference is made to FIG. 1, which illustrates a general method of defining a prefix code set for a set of data symbols $S_i$. The data symbols $S_i$ belong to the set $\{0, 1, 2, \ldots, M_i-1\}$ for integer indexes $i=0, 1, 2, \ldots$ This prefix code set is optimal for a data symbol set with geometric distributions in the form $P(s)=p^s(1-p)$.

Defining the prefix code set includes determining values for a set of parameters that define a number of code words in an initial class (110) and the growth of at least one additional class of code words (112). The parameters may include m, w, and d. The parameter m is a positive integer that defines a number of code words in an initial class. The parameters w and d define linear growth. The number of code words in consecutive classes is repeated w times before growing by d. The number of code words is non-decreasing from the $k^{th}$ class to the $k+1^{th}$ class. For $m=d=1$ and $w=1$, the first class has one code word, the second class has two code words, and the $j^{th}$ class has one more code word than the $j-1^{th}$ class. This code is resilient to estimation errors in the code parameter m.

The value for parameter m may be computed from the log of the average symbol value. The parameters w and d depend on the reliability of the computation of the best m. An example of a general rule is as follows:

High reliability: w large, d small (e.g., w=8, d=1).
Low reliability: w small, d large (e.g., w=1, d=4).

The parameters may instead include k, b and w. The number of code words in a class is $b^k$. The initial value for k defines the number of code words in the initial class. After w consecutive classes having the same number of code words, the exponent k is increased (e.g., $2^k$). For $b=w=k=2$, the first and second classes have $2^2$ code words, the third and fourth classes have $2^3$ code words, the fifth and sixth classes have $2^4$ code words, and so on.

Values for parameters (m, w, d or b, w, k) may be estimated prior to encoding (that is, a priori) or at encoding. If the parameters are decided upon a priori, an encoder does not have to estimate them. As a first example, all three parameters are decided upon a priori (e.g., by convention). As a second example, parameter d or k is determined in advance of encoding, and the other parameters are estimated at encoding. As a third example, all three parameters are estimated at encoding.

The prefix code set can be represented by tree structures. A tree structure includes a plurality of subtrees, with each subtree representing a class of code words. Each subtree has a number of branches, with each branch representing a bit, and leaves representing code words. The number of code words in the $k^{th}$ subtree is less than the number of code words in the $w+k^{th}$ subtree, and the number of code words from the $k^{th}$ subtree to the $k+1^{th}$ subtree is non-decreasing.

Exemplary binary tree structures are illustrated in FIGS. 2a–2e. These tree structures describe a unary code, in which q 1-bits are followed by a 0-bit (or, in the alternative, q 0-bits are followed by a 1-bit). The unary code is composed of the bits indicated by the horizontal arrows in FIGS. 2a–2e, followed by the first vertical arrow. This special tree layout stresses the importance of those bits. The tree structures of FIGS. 2a–2c exhibit linear growth, while the tree structures of FIGS. 2d–2e exhibit exponential growth.

Figure 2A:
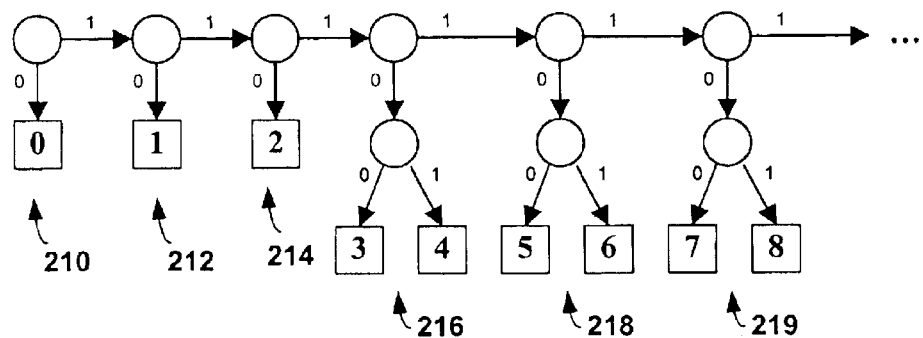
FIGS. 2a–2e are illustrations of exemplary tree structures in accordance with an embodiment of the present invention.

FIG. 2a illustrates a tree structure for parameter m=1, d=1, and w=3. The first subtree (class 210) has one branch and, therefore, represents one code word (0). The second and third subtrees (classes 212 and 214) represent one code word apiece (1) and (2). The fourth subtree (class 216) represents two code words (3,4) —a growth of one code word. The fifth and sixth subtrees (classes 218 and 219) each represent two code words (5,6) and (7,8). The following next three subtrees (not shown in the figure) would represent three code words apiece as (9,10,11), (12,13,14), and (15,16,17). Exemplary code words corresponding to the tree structure of FIG. 2a are shown in Table 1.

TABLE 1

| Symbol s | Code word | Bits B(s) |
| --- | --- | --- |
| 0 | 0 | 1 |
| 1 | 10 | 2 |
| 2 | 110 | 3 |
| 3 | 11100 | 5 |
| 4 | 11101 | 5 |
| 5 | 111100 | 6 |
| 6 | 111101 | 6 |
| 7 | 1111100 | 7 |
| 8 | 1111101 | 7 |

Figure 2B:
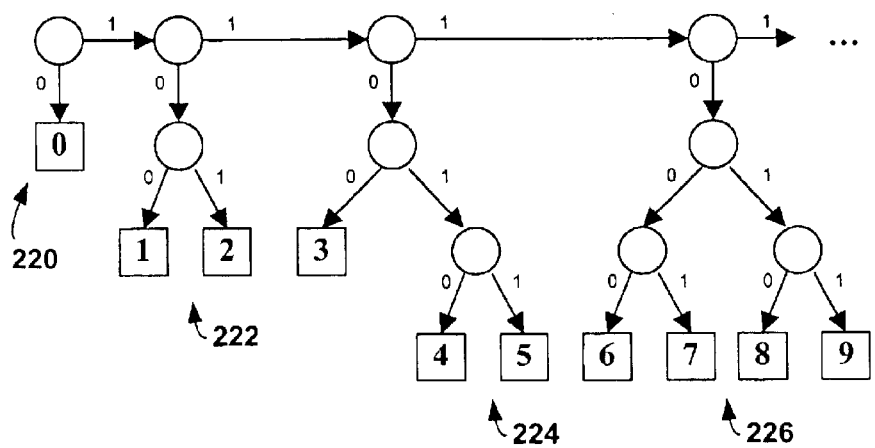

FIG. 2b illustrates a tree structure for parameters m=1, d=1, and w=1. The number of code words grows linearly at each node of the unary code. Thus, the number of code words grows as 1, 2, 3, . . . , and the code word in the first subtree (class 220) is (0), the code words in the second subtree (class 222) are (1,2), the code words in the third subtree (class 224) are (3,4,5), the code words in the fourth subtree (class 226) are (6,7,8,9), etc.

Figure 2C:
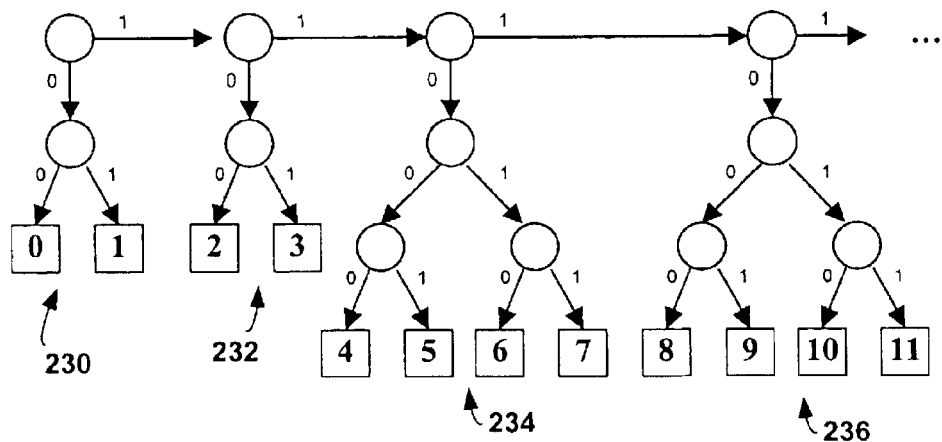

FIG. 2c illustrates a tree structure for parameters m=2, d=2, and w=2. The number of code words grows linearly at every other node of the unary code. The code words in the first subtree (class 230) are (0,1), the code words in the second subtree (class 232) are (2,3), the code words in the third subtree (class 234) are (4,5,6,7), the code words in the fourth subtree (class 236) are (8,9, 10, 11), etc.

Figure 2D:
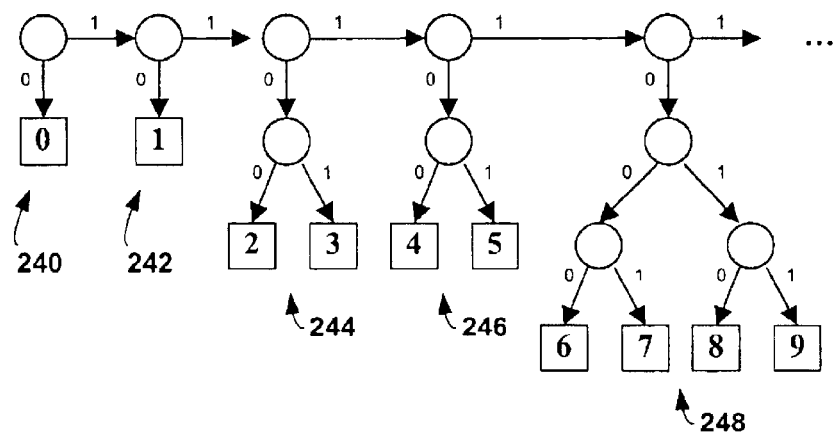

FIG. 2d illustrates a tree structure for parameters b=w=2, and k=0. The number of code words in the subtrees grows exponentially in groups of two. Thus, the first and second subtrees (classes 240 and 242) have code words of (0) and (1), the third and fourth subtrees (classes 244 and 246) have code words of (2,3) and (4,5), the fifth subtree (class 248) and sixth subtree (the sixth subtree is not shown) have code words of (6,7,8,9) and (10,11,12,13), etc.

Figure 2E:
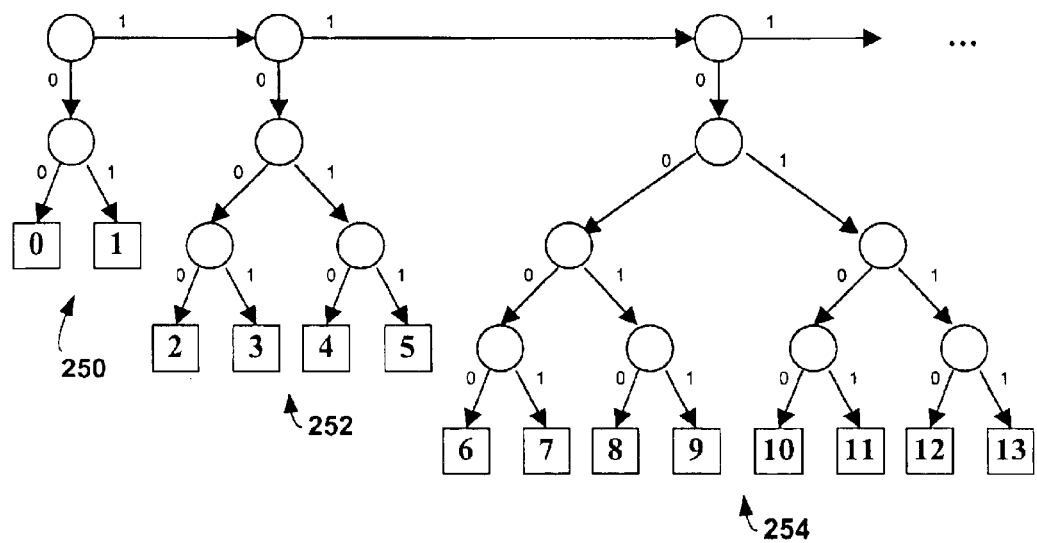

FIG. 2e illustrates a tree structure for parameters k=w=1 and b=2. The first subtree (class 250) has $2^1$ code words, the second subtree (class 252) has $2^2$ code words, the third subtree (class 254) has $2^3$ code words, etc.

The prefix code set according to the present invention is more resilient than conventional Golomb coding, since the prefix codes are adaptable and can change quickly to classes with larger numbers of bits. A core set of code words can be implemented in a lookup table (LUT), and the remaining code words (however many there will be) can be computed. Such efficient memory usage makes table look-up very fast, since the tables are not too large (preferably they can fit in the CPU's fast cache, or are accessed sequentially). The prefix code set according to the present invention is especially efficient for compressing non-stationary waveform sources such as video and audio, since the coding can be performed in a single pass, and the coding des not require knowledge of conditional probabilities of the data symbols.

Figure 3:
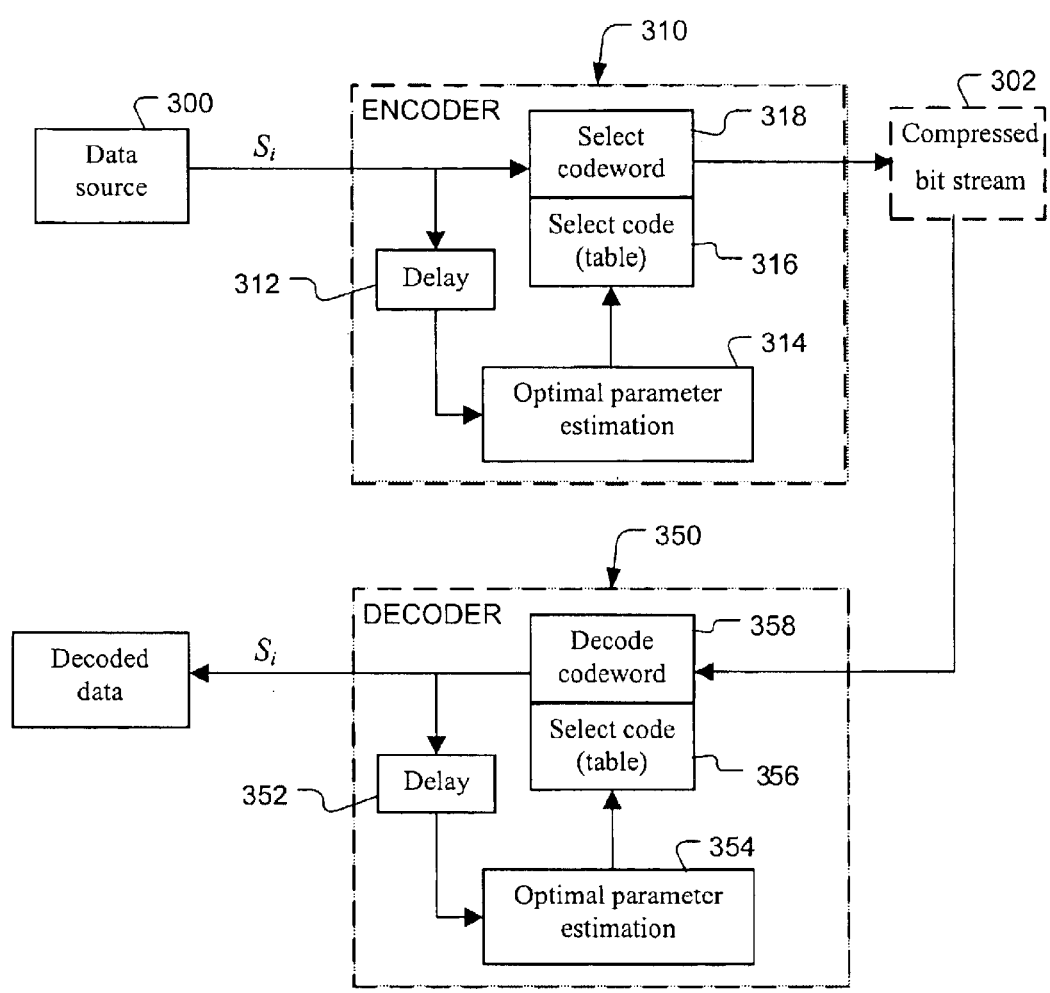
FIG. 3 is an illustration of a method for encoding and decoding a set of data symbols in accordance with an embodiment of the present invention.

Reference is now made to FIG. 3, which illustrates an encoder 310 for coding a data symbols $S_i$, and a decoder 350 for decoding a bit stream. The data symbols Si are provided by a data source 300.

At block 312, the encoder 310 delays the first few incoming symbols. At block 314 the encoder 310 estimates the optimal coding parameters m, w, d or b, w, k. The estimates may be based on knowledge of the distribution of the data symbols $S_i$.

At block 316, the encoder 310 uses the estimated coding parameters to select a prefix code (i.e., a set of code words). The code words of the selected code may be stored in a lookup table. The lookup table may be organized as a two-dimensional table, where the code word $G_{mi}(S_i)$ is the entry in column mi and row $S_i$.

At block 318, a code word is selected from the lookup table and copied to a bit stream 302. The selected code word $G_{mi}(S_i)$ corresponds to the symbol $S_i$.

If a code word is not found in the lookup table, the code word is computed (318). The code word may be computed with the same algorithm used to build the lookup table.

The decoder 350 performs the reverse operation of the encoder 310. Thus the decoder delays the first few code words in the bit stream 302 (at block 352), determines the optimal parameters m,w,d or b,w,k (at block 354), uses the estimated coding parameters to select a prefix code (at block 356), and uses the next code word in the bit stream 302 to look up or compute a symbol from the lookup table (at block 358).

Figure 4:
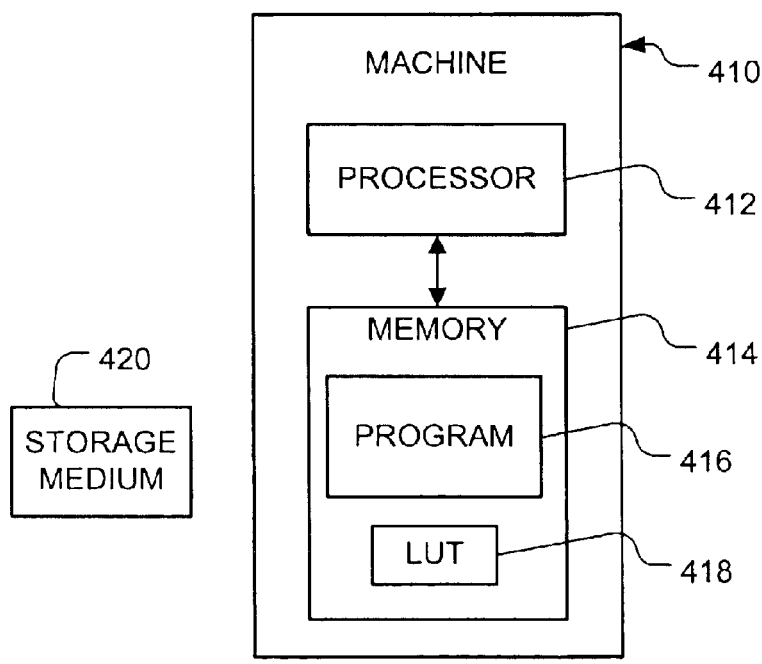
FIG. 4 is an illustration of a system in accordance with an embodiment of the present invention.

Reference is now made to FIG. 4, which shows a machine 410 for implementing one or both of the encoding and decoding. The machine 410 includes a processor 412 and memory 414. The memory 414 stores a program 416 that, when executed, causes the processor 412 to encode a source of data according to the method above, or decode a compressed bit stream according to the method above. The machine 410 may transmit or receive the data over a transmission medium such as the Internet, or it may store or access the data from a storage medium (e.g., an optical disc).

A lookup table 418 containing a core set of code words is also stored in the memory. During encoding or decoding, the lookup table 418 can be stored in cache memory of the processor 412.

During execution, the program can be stored in "articles" such as the memory 414. The program can be distributed via a transmission medium such as the Internet, or it may be distributed in articles such as removable storage media (e.g., optical discs) 420.

The present invention is not limited to the specific embodiments described and illustrated above. Instead, the present invention is construed according to the claims that follow.

What is claimed is:

1. A method of processing a set of data, the method comprising selecting code words from a prefix code set, the prefix code set defined by a set of parameters that define a number of code words in an initial class and the growth of at least one additional class of code words.

2. The method of claim 1, wherein one of the parameters defines the number of times a class is repeated before growing.

3. The method of claim 1, wherein at least one of the parameters defines the growth.

4. The method of claim 3, wherein the growth is linear.

5. The method of claim 4, wherein values for the parameters m, w and d are determined, where m defines an initial class size, and where a class repeats w times before increasing by d.

6. The method of claim 3, wherein the growth is exponential.

7. The method of claim 6, wherein values for the parameters k, b and w are determined, where k defines and w defines the number of times a class is repeated before k is increased, and $b^K$ defines the class size.

8. The method of claim 1, wherein a value for at least one of the parameters is determined prior to encoding.

9. The method of claim 1, further comprising defining the number of code words in the initial class and the growth prior to selecting the code words.

10. The method of claim 9, wherein the growth is a function of reliability of defining the number of code words in the initial class.

11. The method of claim 1, wherein a core set of code words are selected from a lookup table, and wherein a code word not found in the lookup table is selected by computing a new class and assigning a code word from the new class, the new class grown according to the parameters.

12. The method of claim 1, wherein the code words are selected to encode the data.

13. The method of claim 1, wherein the code words are selected to decode the data.

14. Apparatus comprising a processor for performing the method of claim 1.

15. An article for a computer, the article comprising computer memory encoded with a program that, when executed, causes the computer to perform the method of claim 1.

16. An article comprising computer memory storing data encoded according to claim 1.

17. A system comprising:
a source of non-stationary data; and
a machine for transforming the data, and coding the transformed data,
the coding including selecting the code words according to the method of claim 1.

18. The system of claim 17, wherein the source is a source of video data.

19. The system of claim 18, wherein the machine includes table lookup for coding the transformed data.

20. The system of claim 18, wherein the coding is performed in a single pass.

21. A system for coding data words, the system comprising an encoder for accessing values for a set of parameters that define a number of code words in an initial class of a prefix code and the growth of at least one additional class of code words in the prefix code.

22. Apparatus for processing a data symbol, the apparatus comprising:
a lookup table comprising a plurality of classes of code words, the classes defined by a set of parameters that define a number of code words in an initial class and the growth of at least one additional class of code words; and
a processor for looking up a code word in the lookup table, the code word corresponding to the data symbol.

23. The apparatus of claim 22, wherein the processor computes a new class of code words if the data symbol does not have an entry in the look up table, and assigns a code word in the new class to the data symbol, the new class grown according to the parameters.

24. The apparatus of claim 22, wherein one of the parameters defines the number of times a class is repeated before growing.

25. The apparatus of claim 22, wherein the growth is linear.

26. The apparatus of claim 22, wherein the growth is exponential.

27. The apparatus of claim 22, wherein the growth is a function of reliability of defining the number of code words in the initial class.

28. The apparatus of claim 22, wherein the code words are selected to encode the data.

29. The apparatus of claim 22, wherein the code words are selected to decode the data.

30. An article for a processor, the article comprising computer memory encoded with a program for instructing the processor to process data with a prefix code that follows a set of parameters, the parameters defining a number of code words in an initial class and growth of at least one additional class of code words in the prefix code.

31. The article of claim 30, wherein one of the parameters defines the number of times a class is repeated before growing.

32. The article of claim 30, wherein the growth is linear.

33. The article of claim 30, wherein the growth is exponential.

34. The article of claim 30, wherein the growth is a function of reliability of defining the number of code words in the initial class.

35. The article of claim 30, wherein the code words are selected to encode the data.

36. The article of claim 30, wherein the code words are selected to decode the data.

* * * * *